United States Patent [19]
Schreyer et al.

[11] Patent Number: 5,177,502
[45] Date of Patent: Jan. 5, 1993

[54] ARRANGEMENT FOR DETACHABLY FASTENING MODULES TO A MODULE CARRIER

[75] Inventors: Siegfried Schreyer, Glonn; Rudolf Waechtler; Edmund Creutzmann, both of Munich, all of Fed. Rep. of Germany

[73] Assignee: Siemens Aktiengesellschaft, Munich, Fed. Rep. of Germany

[21] Appl. No.: 849,814

[22] Filed: Mar. 11, 1992

Related U.S. Application Data

[63] Continuation of Ser. No. 457,748, Sep. 14, 1990, abandoned.

[30] Foreign Application Priority Data

Mar. 15, 1988 [DE] Fed. Rep. of Germany ....... 3808619
Jun. 1, 1988 [DE] Fed. Rep. of Germany ........... PCT/DE88/00319

[51] Int. Cl.$^5$ ............................................. G01D 15/16
[52] U.S. Cl. ............................ 346/107 R; 346/139 R
[58] Field of Search .............. 346/108, 107 R, 160, 346/139 R

[56] References Cited

U.S. PATENT DOCUMENTS

| | | | |
|---|---|---|---|
| 4,703,334 | 10/1987 | Mochimaru et al. | 346/107 R |
| 4,780,730 | 10/1988 | Dodge et al. | 346/108 |
| 4,821,051 | 4/1989 | Hediger | 346/107 R |
| 4,942,405 | 7/1990 | Dody et al. | 346/107 R |
| 5,036,339 | 7/1991 | Hediger | 346/107 R |

FOREIGN PATENT DOCUMENTS

| | | |
|---|---|---|
| 0232098 | 8/1987 | European Pat. Off. |
| 8704510 | 7/1987 | Fed. Rep. of Germany |

OTHER PUBLICATIONS

IBM Technical Disclosure Bulletin vol. 22 No. 3 Aug. 1979 pp. 960–961.

*Primary Examiner*—Mark J. Reinhart
*Attorney, Agent, or Firm*—Hill, Van Santen, Steadman & Simpson

[57] ABSTRACT

What is required for the arrangement of modules (11) on a module carrier (13), for example in an optical character generator (1), is that the modules (11) be positively and non-positively fixed on the module carrier (13), particularly given the occurrence of thermal expansions. In accord with the invention, a fastening means (7) is provided for that purpose that is arranged in a bore (135, 135) inclined relative to the contacting surface of the module (11) and of the module carrier (13) and thereby detachably fastens the module on the module carrier (13). Arrangement for detachably fastening modules (11) on a module carrier (13), particularly for the character generator (1) of a non-mechanical printer.

15 Claims, 5 Drawing Sheets

ARRANGEMENT FOR DETACHABLY FASTENING MODULES TO A MODULE CARRIER

This is a continuation of application Ser. No. 457,748, filed Sep. 14, 1990, now abandoned.

BACKGROUND OF THE INVENTION

The invention is directed to an arrangement for detachably fastening modules to a module carrier.

Modular construction is a method that is wide-spread in technology for constructing mechanical and non-mechanical systems. Compared to compact construction, modular construction is considered more advantageous on one essential point. This is the case when the system to be constructed contains system elements that are to be classified as wear parts and must therefore be replaced with relative frequency. The replacement of only individual wear parts, is compared to the replacement of the entire system, results in the compact construction, despite lower manufacturing costs, being nonetheless ultimately less economical than the modular construction of the system.

Representative of the broad application spectrum of such systems, a typical example from non-mechanical printer technology is recited below. Optical character generators are the crux of such printer equipment that, for example, function according to the principle of electrophotography. The job of these optical character generators is to convert the printing information present in the form of electronic data into an optical image. A photoconductive layer, for example on a photoconductive drum, is subsequently exposed with this optical image. The exposed image is subsequently developed in a known way and, for example, transferred onto paper.

Over and above this, optical character generators that are constructed in line fashion and therefore operate without mechanical motion are advantageous. In this type of character generating, a separate light source must be present for every point that is to be imaged within a line. The number of these light sources within an illumination line of optical character generators is dependent to the greatest possible degree on what kind of printing screen is used for the conversion of the information to be printed. Light-emitting diodes (LEDs) are preferably employed as light sources in the optical character generators. Like all other light sources, these have the disadvantageous property that their useful life is limited. It is therefore important to counter this unavoidable fact by increasing the service-friendliness of the optical character generator; in that the illumination line of the character generator is constructed in modular fashion. Compared to the compact construction, the modular construction, however, frequently exhibits the disadvantage that every individual module must be separately secured to a module carrier with costly, mechanical outlay. Having a disadvantageous effect over and above this for the optical character generator is that the structure of the optical character generator has a critical influence on the nature and fashion of the fastening.

SUMMARY OF THE INVENTION

It is therefore an object of the present invention to create an arrangement of the species initially cited with which modules can be detachably fastened to module carriers and, in particular, with which exposure modules of an optical character generator are fastened wherein both the modules as well as the module carriers are thermically stressed and, consequently, thermal expansions occur. The arrangement provides for detachably fastening these modules in a secured or, respectively, reproducible position and limits the costs for the fastening to a minimum.

In an arrangement of the species initially cited, this object is inventively achieved by a fastening means arranged inclined relative to the contacting surface of the module and of the module carrier and thereby fixes the module on the module carrier.

The solution is particularly distinguished in that a screw/spring connection secures the modules to the module carrier. Over and above this, the screw/spring connection is arranged in a bore of the module carrier or, respectively, of the module in extremely assembly-friendly fashion. Particularly when the contacting surfaces of the module carrier and of the module are worked with greater mechanical precision, the screw/spring connection guarantees a positive seating of the module perpendicular and parallel to the contacting surface of the module carrier. This positive seating is also preserved given external influences, for example given the occurrence of thermal expansions. It is also advantageous in the solution that a good heat transmission with low thermal resistance is established by the high-precision, positive seating of the module on the module carrier. This situation is of significance when both the module as well as the module carrier are thermically stressed. For example, this occurs in optical character generators wherein light sources that emit a thermal dissipated power are arranged on every module within an exposure line.

BRIEF DESCRIPTION OF THE DRAWINGS

Further advantages and developments of the invention derive from the subclaims as well as from the following description of an exemplary embodiment with reference to the drawings. Thereby shown are:

DETAILED DESCRIPTION OF THE PREFERRED EMBODIMENTS

Figure 1:
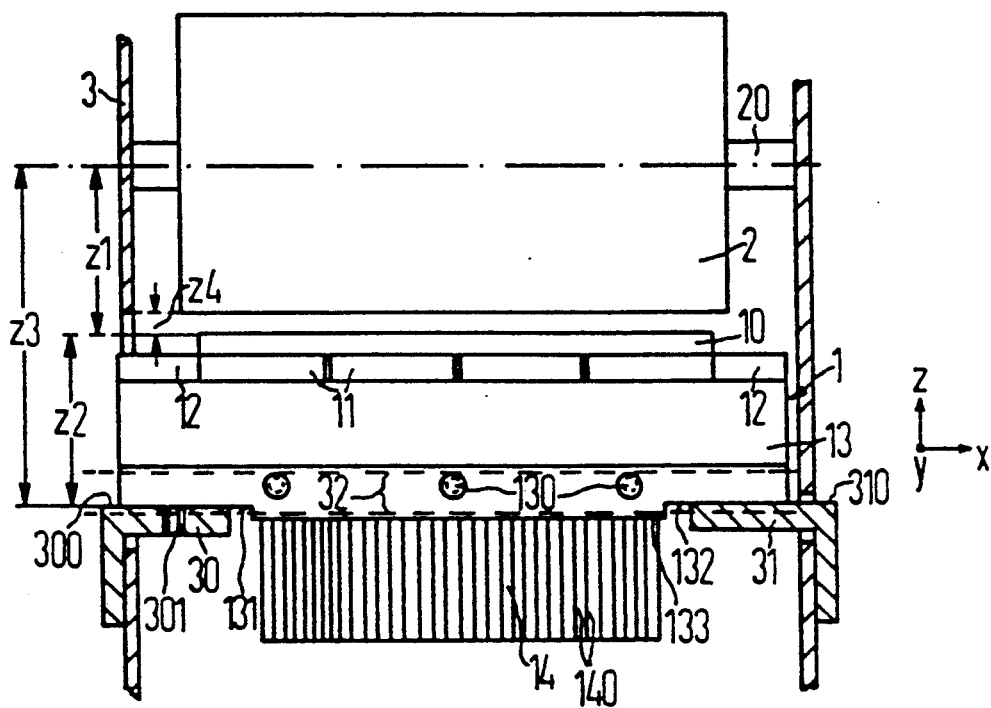
FIG. 1 is a fundamental sub-structure of an electrophotographic printer for producing a latent, electrostatic image, shown in cross section.

FIG. 1 shows how a character generator 1 and a transfer rotatably mount printing drum 2 are built in to a printer housing 3 of a printer. To that end, the transfer printing drum 2 is axially fixed on a spindle 20 that is rotatably seated in the printer housing 3. The character generator 1 is secured in the printer housing 3 under the rotatably seated transfer printing drum 2 at a variable distance z3. To that end, the character generator 1 has both its ends firmly mounted on adjustable fastening elements 30, 31. The fastening elements 30, 31 that are angular in cross section are integrated in the printer housing 3 that such the position of the fastening planes 300 or, respectively, 310 of the fastening elements 30, 31 can be adjusted to the distance z3 with a template, with reference to the rotational axis of the transfer printing drum 2. The distance z3 that is thus set is thereby composed of two different distances z1, z2. It is indispensable for a faultless operation of the printer that an overall tolerance that is prescribed and must be observed for the established distance z3 is not exceeded due to manufacturing and assembly tolerances that occur for the two distances z1, z2.

The overall tolerance is essentially defined by an imaging optics 10 of the character generator 1. For the sake of a good image quality, the depth of field of the imaging optics 10 should not be altered due to the tolerances under discussion. This is explained by the fact that the imaging optics 10 reproduces picture elements of light sources, for example light-emitting diodes (LEDs) on, the transfer printing drum 2. These light sources are respectively arranged on an exposure module 11 that is positively connected to the cross piece of a module carrier 13 that is fashioned T-shaped. Detent elements 12 that prevent a displacement of the exposure modules 11 in an x-direction during the operating condition of the character generator 1 are also provided on the cross piece of the module carrier 13. The flange of the module carrier 13 fashioned T-shaped also comprises running rollers 130 that are secured diametrically relative to one another in respective pairs at the two long sides of the end faces. Over and above this, the base area of the flange is divided into two seating surfaces 131, 132 as well as a step surface 133 offset from these two seating surfaces 131, 132 on which a plurality of cooling elements 140 forming a cooling arrangement 14 are fastened, for example by soldering.

For operation of the printer, the character generator is thrust into the printer housing 3 in that the running rollers 130 are movable in the x-direction in guide rails 32 of the printer housing 3, being thrust thereinto until the character generator 1 has its seating surfaces 131, 132 lying against the fastening elements 30, 31 in the fastening planes 300, 310. With respect to the distances z1 through z3 entered in FIG. 1, the character generator 1 integrated in this fashion forms a structural unit together with the transfer printing drum 2 that changes again only given constantly changing, different manufacturing and assembly tolerances. With respect to a dimension z4 that indicates the tangential distance between the transfer printing drum 2 and the imaging optics 10, for example, manufacturing tolerances thus derive that are based on a variable spindle turn of the transfer printing drum 2. When, for example, dz3 equals 0.1 mm applies for an overall tolerance to be demanded for the distance z3 and when a tolerance that is likewise 0.1 mm is taken into consideration for the dimension z4 as a consequence of the spindle turn given simultaneously high-precision manufacture of the transfer printing drum 2, then the character generator 1 must be manufactured with a precision of at least 0.01 mm in order to guarantee a faultless imaging of the picture elements of the light sources onto the transfer printing drum 2. Extremely high demands made of the structural design of the character generator 1 derive therefrom, these to be discussed below in the description of FIGS. 2 through 9.

Figure 2:
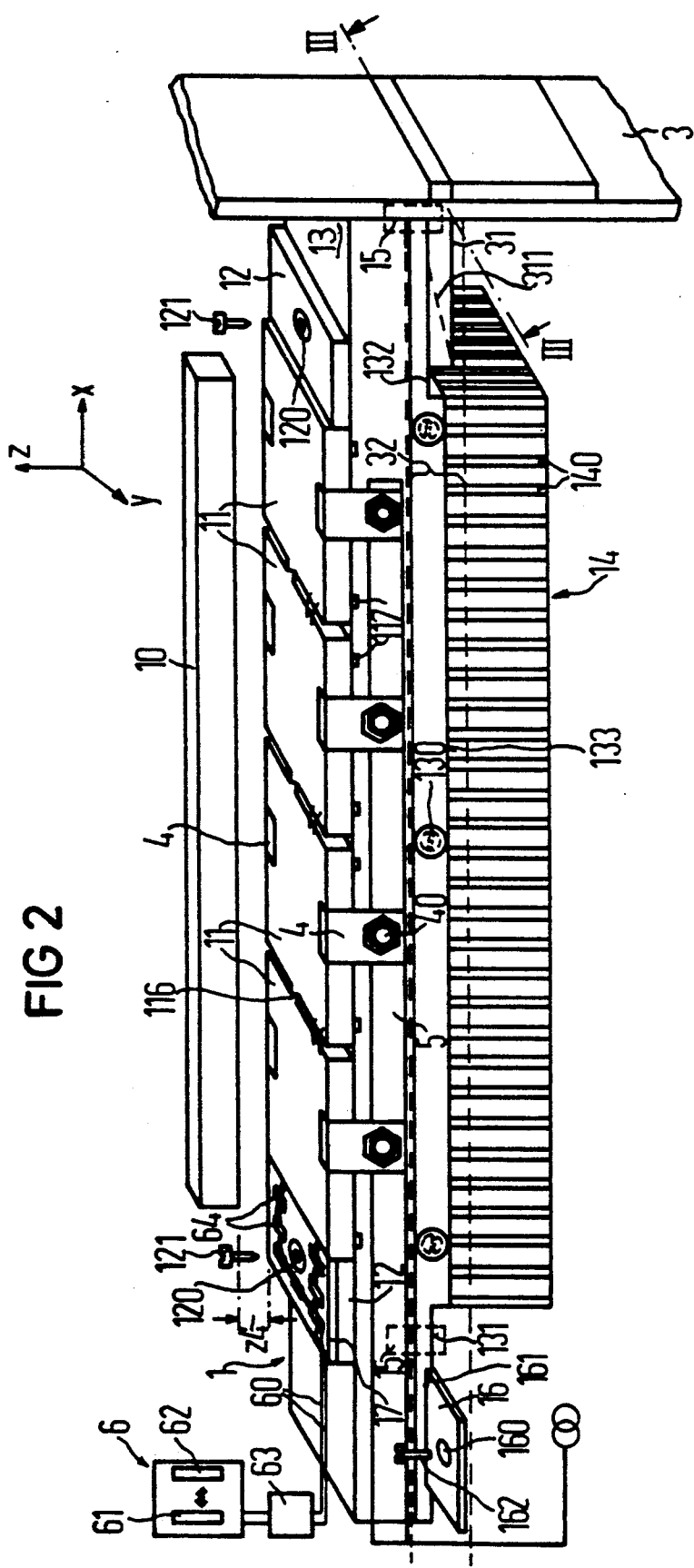
FIG. 2 is an axonometric perspective view of the structure of a character generator that generates latent images.
Figure 3:
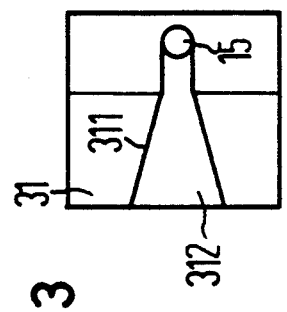
FIG. 3 is a plan view onto a fastening element for fixing the character generator.

To that end, FIG. 2 shows a perspective-axonometric view of the fundamental structure of the character generator 1. The four exposure modules 11 indicated in FIG. 1 are arranged in longitudinal direction on the cross piece of the module carrier 13 with positive lock and non-positive lock. To this end, both contacting surfaces, both that of the module carrier 13 as well of that of the exposure modules 11, are mechanically processed to extremely high precision in a special manufacturing cycle in order to achieve an air gap of less than 2 mm between the two contacting surfaces in the assembled condition. The exposure modules 11 arranged in this fashion abut one another at joining surfaces 116 respectively fabricated with extreme precision. Thus, the air gap between the joining surfaces 116 is likewise smaller than 2 mm. The abutting of the modules 11, however, occurs only in an extremely narrow region. The reasons for this shall be set forth in greater detail in the description of FIG. 3. So that this congruent abutting of the respective modules 11 is also preserved during the operating condition, the position of the exposure modules 11 on the module carrier 13 is fixed for all three coordinate directions. For the x-direction, the detent elements 12 have already been pointed out in the description of FIG. 1. A respective bore 120 is let into these detent elements 12 in order to secure the detent elements 12 at a prescribed location on the web of the module carrier 13, for example with the assistance of fastening screws 121. The spacing of the bores 120 is dimensioned such in the assembled condition of the detent elements 12 that the modules 11 lying between the detent elements 12 are positively clamped in x-direction. The positive fixing of the modules 11 in y-direction and z-direction shall be set forth in greater detail in the description of FIGS. 6, 7, 8. Over and above this, a printed circuit board 17 also lies on the one detent element 12, this printed circuit board 17 being likewise secured with the fastening screw 121.

FIG. 2 also shows that the imaging optics 10 is arranged at a distance z4' over the module surface and that the exposure modules 11 comprise a flexible, electrical ribbon line 4 at their respective end faces 117 that are still freely accessible, being supplied with current for the light-emitting diodes and the control electronics via this ribbon line 4. To this end, every flexible ribbon line 4 is connected via a screwed connection 40 to a planar electrical lead 5 that extends past all exposure modules 11 arranged on the module carrier 13 in x-direction at both long sides of the module carrier web. The necessity of such a lead 5 fashioned with a large area is explained by the fact that currents from 80 through 100 A are not unusual due to the great plurality of light-emitting diodes integrated on the modules 11 of the character generator 1. The drive of the light-emitting diodes is undertaken via data and control lines 60 by a microprocessor-controlled means 6 that, among other things, contains a central processor 61 and a memory 62 for this purpose. This microprocessor-controlled means 6 is followed by an analog-to-digital converter 63 as well as by a plurality of amplifying driver modules 64 that are arranged on the printed circuit board 17. From the driver modules 64, the signals on the data and control lines are forwarded to the light-emitting diodes in amplified fashion.

Under the seating surface 131, the character generator 1 also comprises a fixing element 16 fashioned plate-shaped and, under the seating surfaces 131, 132, comprises a guide pin 15 that respectively projects from the module carrier 13. When the character generator 1 is now thrust into the printer housing 3 with its guide rollers 130 along the guide rail 32 for the purpose of integration therein, then the guide pin 15 that respectively centrally projects under the seating surfaces 131, 132 is brought along a ramp 311 of the fastening elements 30, 31 into the detent shown in FIG. 3 of a guide slot 312 that tapers toward the detent. The taper of the guide slot 312 is dimensioned such that the guide pin 15 is fixed in y-direction without play. The positional fixing of the character generator 1 in x-direction is effected by the plate-shaped fixing element 16. To that end, the fixing element 16 is secured in a recess 161 of the seating surface 131 with which it forms a flush surface, being secured therein such that a part of the fixing element 16 that is of the same size respectively projects at both long sides of the character generator 1. A bore 160 is respectively provided in in the middle in this projecting part. When the character generator 1 has its seating surface 132 in the contacting plane 310 lying on the fastening element 31 and when the character generator 1 likewise has its seating surface 131 in the contacting plane 300 lying on the fastening element 30, then this is fixed in x-direction by two further fastening screws 162 that are let into a corresponding threaded bore 301 according to the illustration in FIG. 1. The character generator 1 or, respectively, the module carrier 13 is thus unambiguously fixed in all three coordinate directions relative to the transfer printing drum 2 shown in FIG. 1.

Figure 4:
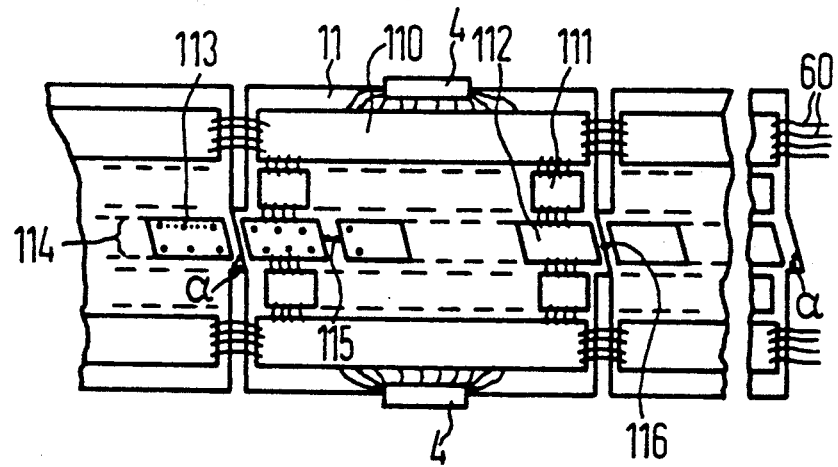
FIG. 4 is a plan view onto an exposure module of the character generator required for generating latent, electrostatic images.
Figure 5:
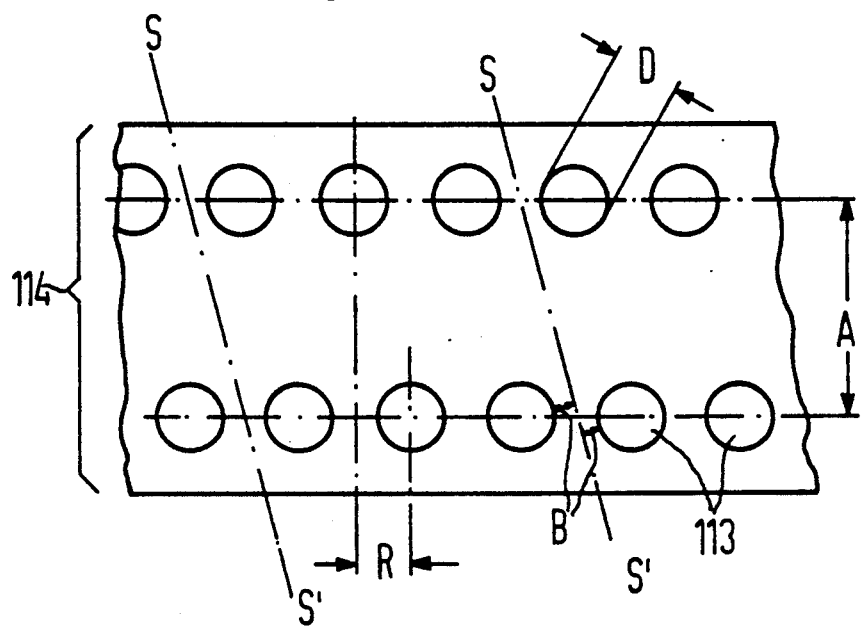
FIG. 5 is an arrangement of the light-emitting diodes (LEDs) combined into an exposure line of the character generator.

In order to be able to subsequently generate latent, electrostatic images on the transfer printing drum 2 with the character generator 1 positioned in such fashion and to thereby be ultimately able to print arbitrary characters on a recording medium, the light-emitting light sources 113 are monolithically integrated on the exposure modules 11—as shown in FIG. 4—with a regular spacing in an exposure line 114, being monolithically integrated as chips 112 having sides parallel pair-by-pair and containing 64 or 128 LEDs dependent on the printing grid. Representative of this, points are entered in FIG. 4 as LEDs. Over and above this, the LEDs are shown enlarged in FIG. 5 as circles having the diameter D. According to FIG. 5, the individual LEDs in the exposure line 114 or, respectively, on the chips 112 are arranged in two rows proceeding at an equal distant spacing A, being respectively arranged in the distance A by an offset R. This offset is determined dependent on the printing grid. Printing grids typically employed are, for example, 240 dpi (dots per inch), 300 dpi and 600 dpi. The offsetting of the LEDs 113 is required, among other reasons, because the diameter D of the LEDs 113 is larger for the said printing grid than the offset R resulting therefrom and the LEDs 113 can therefore not be arranged in a single-row, through exposure line 114. Moreover, the number 64 or, respectively, 128 for the plurality of LEDs 113 per chip 112 on the modules 11 of the current generator 1 is not arbitrarily selected but is based on the conditions related to the digital drive of the LEDs 113. For this digital drive, an integrated circuit 111 is provided for every LED row of the chip 112 on the module 11, as may be seen in FIG. 4. Each of these integrated circuits 111 is connected via a bus system 110 both to the flexible ribbon line 4 as well as to the data and control lines 60 via the driver modules 64 on the printed circuit boards 17 and, thus, is connected to the power supply or, respectively, to the microprocessor-controlled means 6. All printing data of the light-emitting diodes 113 in the exposure line 114 are stored and edited in this means 6. The plurality of these printing data thereby essentially depends on the distance A between the two LED rows. The printing data can be edited all the more easily in the microprocessor-controlled means 6 the smaller this distance A. This demand made of the distance A because of the electronics, however, can no longer be met when the exposure line 114 fashioned in FIG. 5 is to be subdivided into individual chips 112 according to the illustration in FIG. 4 and a distance B between a parting line S . . . S' and the LEDs 113 adjacent thereto is to thereby be as large as possible so that these are not damaged. The largest possible distance B would be established in this case precisely when the distance A between the two LED rows was infinitely large. The solution of this optimization problem is established by the equation $$A = 4R \qquad (1)$$

this is equivalent thereto that the exposure line 114 is parted at an angle of α equals 76° in the center between two neighboring LEDs 113 on the LED row. A different plurality of chips 112 on the individual module 11 derives dependent on which printing grid is selected for the character generator 1. It must thereby be guaranteed in any case that the length of the module 11 in x-direction amounts to a whole-number multiple of the length of the individual chip 112. On the other hand, the number of exposure modules 11 is optimized for different formats of recording mediums, as the following table illustrates.

| Printing Grid | LEDs per Chip | Chips per Exposure Module | Number of Modules for an Line having the width | |
|---|---|---|---|---|
| | | | DIN A4 Transverse | DIN A3 Transverse |
| 240 dpi | 64 | 9 | 5 | 8 |
| 300 dpi | 64 | 14 | 4 | 6 |
| 600 dpi | 128 | 14 | 4 | 6 |

In accord with the module division, the blank from which the individual exposure modules 11 are manufactured is parted with particular care at the angle α in the region of the exposure line 114 and is then subsequently mechanically processed with extreme tolerance precision. This is required so that the joining surfaces 116 that arise due to the mechanical processing do not have a disadvantageous influence on the homogeneity of the overall exposure line 114 over all exposure modules 11 of the character generator 1 when the modules 11 are clamped in x-direction. That these joining surfaces 116 do not have a disadvantageous influence on the homogeneity, on the other hand, is only established by an adequately large joining gap 115 between the individual chips 112 on every module 11. The size of the joining gap 115, however, is in turn dependent to the farthest-reaching degree on how large the distance B is between the parting line S . . . S' and the neighboring LEDs 113.

Figure 6:
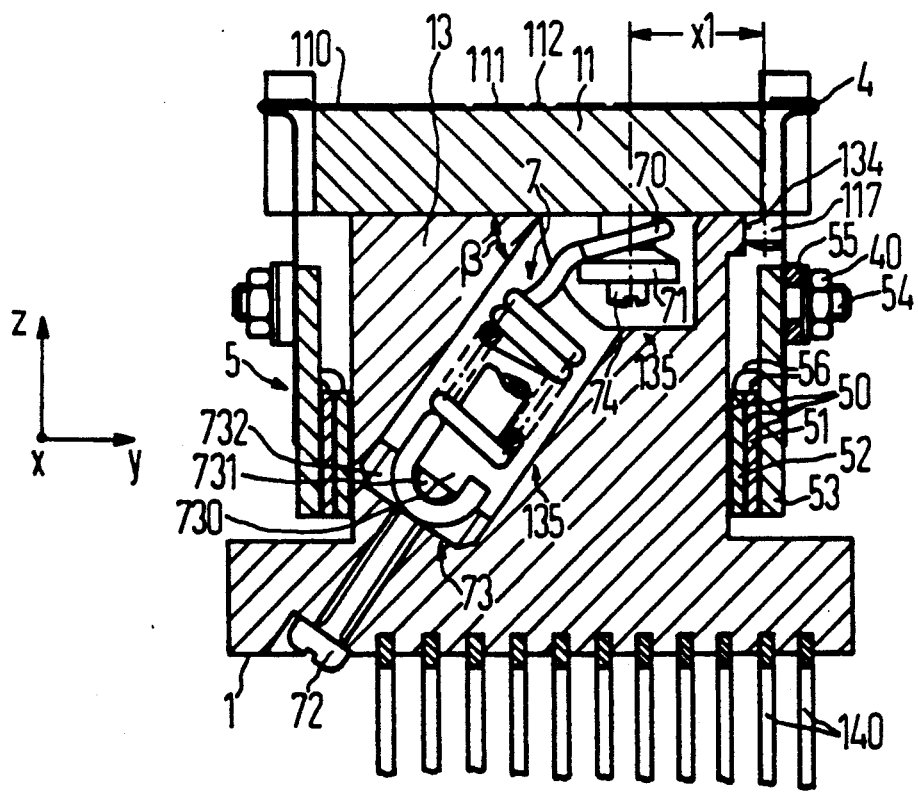
FIG. 6 is a cross section through the character generator comprising a first embodiment for fastening the exposure modules.

FIG. 6 shows a cross section through the character generator 1 in order to thus illustrate the fixing of the individual modules 11 on the web of the T-shaped module carrier 13. The prerequisite for a first fastening means 7 functioning in this fashion, as is shown in FIG. 6, are the contacting surfaces of the module carrier 13 and of the individual modules 11 that are mechanically worked with extreme precision. The same is also true in this context for a seating surface 134 of the module carrier 13. In the assembled condition of the exposure module 11, a seating pin 117 presses positively against this seating surface 134. According to the illustration in FIG. 2, two such seating pins 117 are provided for every exposure module 11. To that end, the seating pins 117 are let into the respective exposure modules 11 with a firm seat. Over and above this, each of these exposure modules 11 comprises a threaded bore on the contacting surface between the two seating pins 117 at a distance x1 therefrom, a screw 74 having a first formed part 71 that surrounds the screw shank and broadens in radial direction toward the screw head being inserted into this threaded bore. A coil spring 70 that can be loaded for tensile stress is secured around this formed part. A second formed part 73 is inserted into this coil spring 70. To that end, this second formed part 73 comprises a cylindrical shank 730 comprising an inside thread and outside thread. The outside thread is thereby fashioned only to such an extend in axial direction in order to be able to secure a hexagonal nut 732 on the cylindrical shank, this hexagonal nut 32 comprising a segment-like nose 731 fashioned by mechanical processing. The integration of this formed part 73 into the spring 70 ensues such that the other spring end surrounds the nose 731. This spring 70 is guided in a cylindrical bore 135 that, for example, penetrates from the contacting surface of the module carrier 13 through the web of the module carrier 13 up to, initially, the transition between web and flange at an angle $\beta$ of 55° relative to the contacting surface of the module carrier 13. At this latter location, the bore 135 is reduced in size to a maximum of the diameter of a screw drive 72 down to the base area of the module carrier flange. At the respective end of the bore, this bore is liberally bored in accord with the outside dimension of the screw head of the screw drive 72 or, respectively, the dimension of the screw 74 and of the first formed part 71. In the assembled condition of the module 11 when this has its seating surface lying against the web of the module carrier 13, the module 11 is firmly clamped to the web of the module carrier 13 by the spring power acting in z-direction and y-direction when the screw drive 72 is turned in clockwise direction and, on the other hand, the seating pin 117 of the exposure module 11 is pressed against the seating surface 134 of the module carrier 13.

FIG. 6 also shows how the planar electrical lead 5 is constructed in combination with the flexible ribbon line 4. In accord therewith, the lead 5 at both long sides of the module carrier web is respectively composed in layers of three electrically non-conducting insulating bars 50, of respectively two power supply bus bars 51, 52 that differ from one another in terms of potential compared to the grounded potential of the module carrier 13 and of a respective two-pole contact bus bars 53, whereby the contact bus bar 53 is respectively connected to the power supply bus bars 51, 52 via two power leads 56. Over and above this, the contact bus bar 53 comprises a threaded peg 54 projecting perpendicularly outward onto which the flexible ribbon line 4, a washer 55 are successively pushed and the contact between the contact rail 53 and the flexible ribbon 4 is produced by the threaded 40. The planar electrical lead 5 is secured in that, first, the electrically non-conductive insulating bars 50 and the power supply bus bars 51, 52 are glued on in alternating succession and, subsequent thereto, the contact bus bar 53 is glued to the respective long side of the module carrier web.

Figure 7:
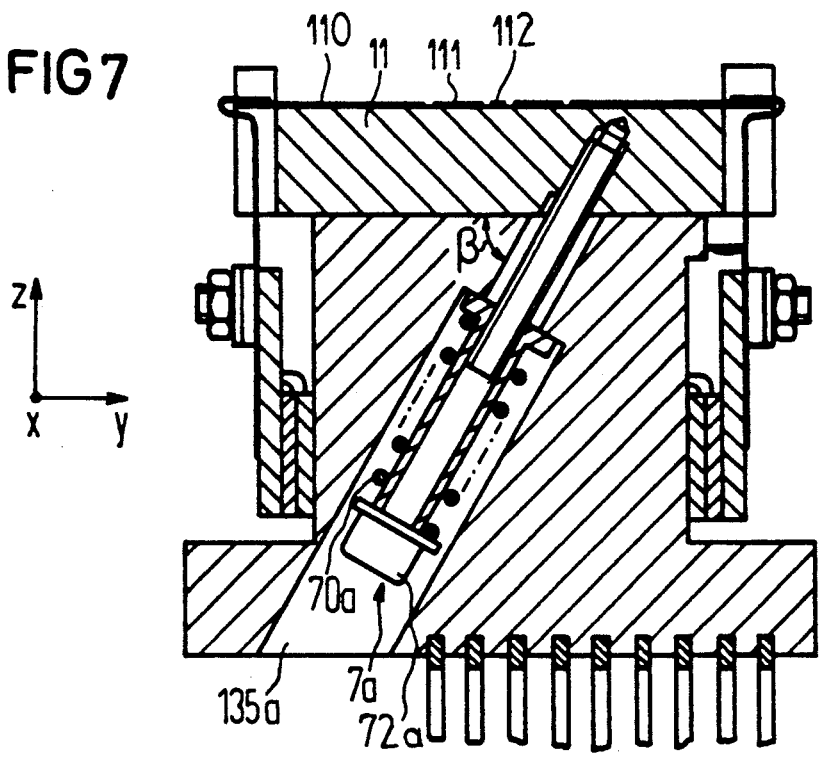
FIG. 7 is a cross section through the character generator comprising a second embodiment for fastening the exposure modules.

Alternatively to the embodiment of the module fastening just set forth, FIG. 7 shows a possibility of directly screwing the exposure modules 11 to a second fastening means 7a and of thereby using a compression spring 70a for the force that opposes the screw force of a first screw 72a. A bore 135a is formed in the contacting surface of the module carrier web at the angle $\beta$ relative to the contacting surface of the module carrier web for guiding the second fastening means 7a. For affixing the exposure module 11, the second fastening means 7a is introduced into the bore 135a proceeding from the base area of the flange.

Figure 8:
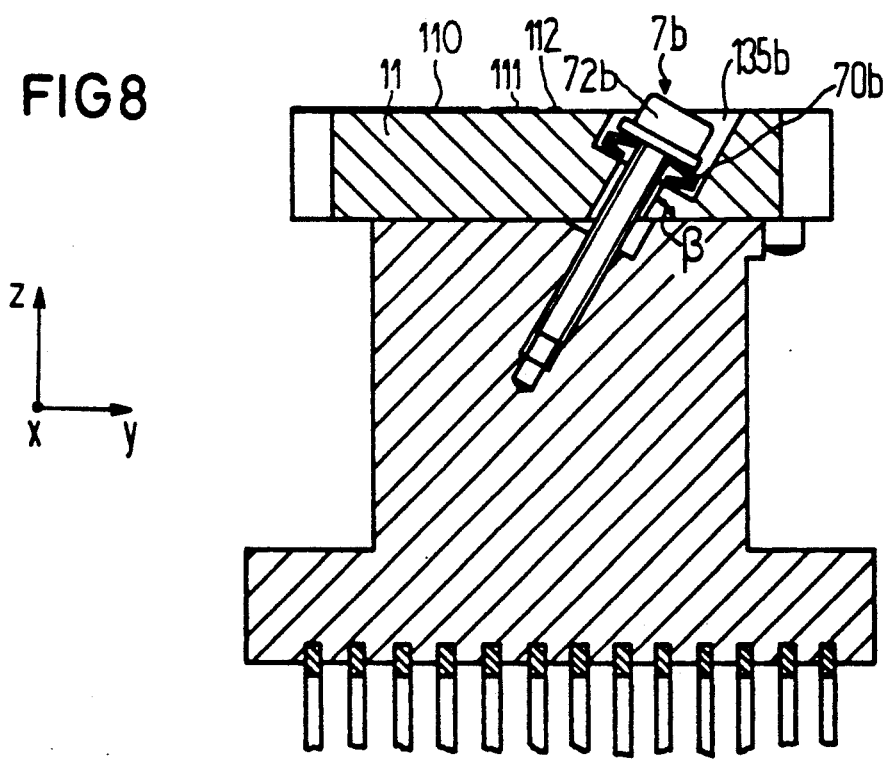
FIG. 8 is a cross section through the character generator comprising a third embodiment for fastening the exposure modules.

FIG. 8 discloses a further alternative for affixing the modules 11 on the module carrier web. Differing from the two preceding embodiments, a third fastening means 7b is let into a bore 135b proceeding from the module side, this fastening means 7b being inclined at the angle $\beta$ relative to the contacting surface of the exposure module 11. The spring power opposing the clamping of is a second screw 72b is produced by a Belleville spring washer 70b that reacts to compressive stresses. This embodiment for fixing the module, however, can only be used for exposure modules 11 wherein the integration density of the chips 112 is less by nearly one-half. For example, this type of module fastening is thus possible in character generators 1 having a printing grid of 240 dpi.

Figure 9:
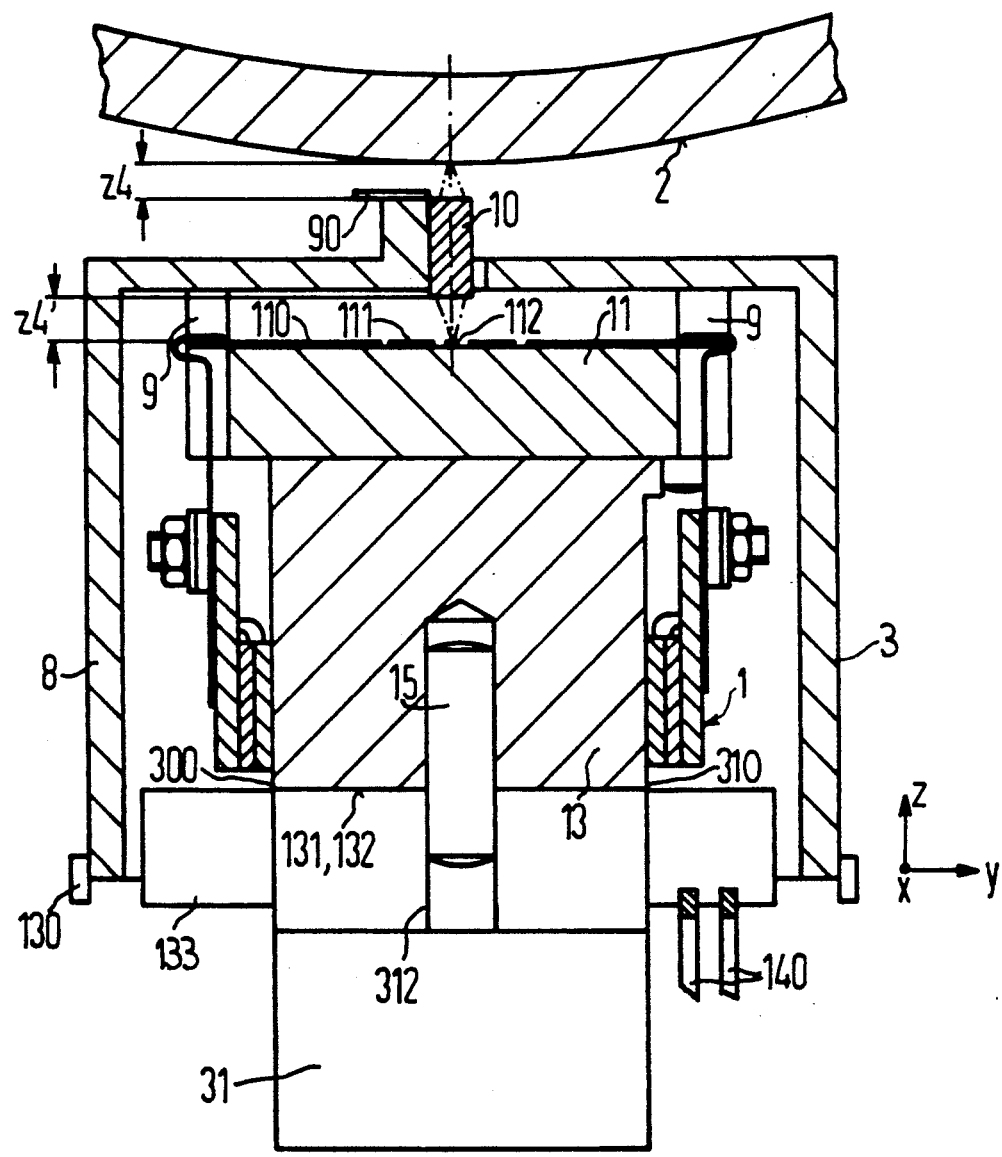
FIG. 9 is a section through the character generator.

FIG. 9 shows how the character generator 1 is fixed in Y-direction in the printer housing 3 in a section through the character generator 1. To that end, it is particularly shown how the guide pin 15 is let into the web of the module carrier 13. It is also shown how the imaging optics 10 is arranged on the chip 112 of the exposure modules 11 in Z-direction and Y-direction relative to the transfer printing drum 2 and relative to the light sources 113. With respect to its imaging geometry, the imaging optics 10 is of such a nature that the light points generated in the exposure line 114 of the exposure module 11 are respectively projected onto the transfer printing drum 2 in an imaging scale of 1:1. In order to achieve an extremely good imaging quality of the light points, the distances z4, z4' that are present must be identical. To that end, the imaging optics 10 is integrated in a cover 8 and is centrally positioned with this over the exposure line 114 or, respectively, over the chips 112. The cover 8 is in turn fixed relative to the exposure modules 11 by the spacers 9. Over and above this, the cover 8 is fashioned such that the character generator 1 is protected against outside contamination up to the running rollers 130, this contamination particularly occurring when developing the latent, electrostatic images on the transfer printing drum 2. In turn, the imaging optics 10, which, according to FIG. 2, extends over the entire exposure line 114 of the character generator 1 and thereby projects every light point of the light-emitting diodes 113 onto the transfer printing drum 2 in the said imaging scale, is protected against contaminates by a closure mechanism 90 that does not cover the imaging optics 10 during the imaging event. To that end, the closure mechanism 90 is seated displaceable on the cover 8 in y-direction.

We claim:

1. An arrangement for detachably fastening modules on a module carrier, comprising:
   a circuit module having a substantially planer underside contacting surface;
   a module carrier having a substantially planer top contacting surface on which said underside contacting surface of said circuit module bears, said circuit module being mounted on said module carrier;
   a fastening means for fastening said circuit module on said module carrier, said fastening means being inclined relative to said underside contacting surface of said circuit module and to said top module at a predetermined position both perpendicular to and parallel to said top contacting surface on said module carrier.

2. An arrangement according to claim 1, wherein said fastening means further comprises: a seating surface on said module carrier perpendicular to said top contacting surface, said fastening means urging said circuit module against said seating surface.

3. An arrangement according to claim 2, further comprising: seating pins extending from said underside contacting surface of said circuit module, said fasting means urging said seating pins against said seating surface.

4. An arrangement according to claim 1, further comprising: a through opening in said module carrier at an acute angle to said top contacting surface, said fastening means being arranged in said through opening inclined at the acute angle relative to said top contacting surface.

5. An arrangement according to one of the claims 1 or 4, wherein said fastening means comprises a screw and a spring mounted together and connected between said module carrier and to said circuit module.

6. An arrangement according to one of the claims 1 through 3, further comprising: two detent elements on said module carrier, said circuit module being clamped on said module carrier between said two detent elements.

7. An arrangement according to claim 5, wherein said spring and screw mounted together comprises a screw drive, a formed part and a tension spring; said screw drive being plugged into said through opening; said screw drive being screwed into said formed part; said formed part being inserted into said tension spring; and said formed part together with said tension spring being plugged into said through opening.

8. An arrangement according to claim 7, wherein said formed part comprises a cylindrical shank having an inside thread and outside thread and a ring element that is screwed onto said outside thread of said cylindrical shank.

9. An arrangement according to claim 8, wherein said ring element comprises a segmented nose that is connected to one end of said tension spring.

10. An arrangement according to claim 7, further comprising: a further formed part that is connected to said tension spring is secured on said contacting surface of said circuit module.

11. An arrangement according to claims 1 or 7, wherein said through opening penetrates said module carrier.

12. An arrangement according to claim 5, wherein said screw and spring mounted together comprise a fastening screw and a compression spring.

13. An arrangement according to claim 4, wherein said through opening penetrates said circuit module.

14. An arrangement according to claim 13, wherein said screw and spring mounted together comprise a fastening screw and a spring washer.

15. An arrangement according to claim 1, wherein said circuit module comprises a plurality of light sources in an exposure line that are operable to produce a latent, electrostatic image on a transfer printing drum of a non-mechanical printer.

* * * * *